United States Patent
Schmidhammer

(10) Patent No.: US 8,432,236 B2
(45) Date of Patent: Apr. 30, 2013

(54) COMPACT HIGHLY INTEGRATED ELECTRICAL MODULE WITH INTERCONNECTION OF BAW FILTER AND BALUN CIRCUIT AND PRODUCTION METHOD

(75) Inventor: Edgar Schmidhammer, Stein an der Traun (DE)

(73) Assignee: Epcos AG, Munich (DE)

( * ) Notice: Subject to any disclaimer, the term of this patent is extended or adjusted under 35 U.S.C. 154(b) by 356 days.

(21) Appl. No.: 12/727,393

(22) Filed: Mar. 19, 2010

(65) Prior Publication Data

US 2010/0237962 A1 Sep. 23, 2010

(30) Foreign Application Priority Data

Mar. 20, 2009 (DE) .......... 10 2009 014 068

(51) Int. Cl.
*H03H 7/42* (2006.01)
*H03H 9/00* (2006.01)

(52) U.S. Cl.
USPC .......................................... 333/25; 333/187

(58) Field of Classification Search .......... 333/25, 333/26, 187, 188, 189, 190, 191, 192
See application file for complete search history.

(56) References Cited

U.S. PATENT DOCUMENTS

| | | | |
|---|---|---|---|
| 6,670,866 B2 * | 12/2003 | Ella et al. | 333/133 |
| 6,946,928 B2 | 9/2005 | Larson, III et al. | |
| 6,963,257 B2 | 11/2005 | Ella et al. | |
| 7,057,477 B2 | 6/2006 | Wang | |
| 7,057,478 B2 | 6/2006 | Korden et al. | |
| 7,102,460 B2 | 9/2006 | Schmidhammer et al. | |
| 7,196,596 B2 | 3/2007 | Sul | |
| 7,277,403 B2 * | 10/2007 | Frank | 370/282 |
| 7,307,331 B2 * | 12/2007 | Kipnis et al. | 257/499 |
| 7,479,850 B2 * | 1/2009 | Kearns et al. | 333/189 |
| 7,554,419 B2 * | 6/2009 | Inoue et al. | 333/26 |
| 7,626,472 B2 * | 12/2009 | Davies-Venn et al. | 333/26 |
| 7,952,458 B2 * | 5/2011 | Ezzeddine | 336/200 |
| 2005/0129030 A1 | 6/2005 | Choi et al. | |
| 2006/0028298 A1 | 2/2006 | Nakamura et al. | |
| 2006/0061435 A1 | 3/2006 | Sul | |
| 2006/0066419 A1 | 3/2006 | Iwaki et al. | |
| 2006/0119453 A1 | 6/2006 | Fattinger et al. | |
| 2007/0210876 A1 | 9/2007 | Yahata et al. | |
| 2007/0296521 A1 | 12/2007 | Schmidhammer | |

* cited by examiner

*Primary Examiner* — Dean O Takaoka
(74) *Attorney, Agent, or Firm* — Nixon Peabody LLP

(57) ABSTRACT

A highly integrated electrical module is specified which comprises a filter circuit and a balun circuit. The space requirement is reduced by circuit components of the balun circuit being arranged at least in part on an inner side of the housing of the filter circuit.

20 Claims, 3 Drawing Sheets

COMPACT HIGHLY INTEGRATED ELECTRICAL MODULE WITH INTERCONNECTION OF BAW FILTER AND BALUN CIRCUIT AND PRODUCTION METHOD

CROSS-REFERENCE TO RELATED APPLICATION

This application claims the benefit under 35 U.S.C. §119 of Germany Patent Application Serial No. 10 2009 014 068.9, filed in Germany on Mar. 20, 2009, entitled "Compact Highly Integrated Electrical Module with Interconnection of BAW Filter and Balun Circuit and Production Method."

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

FIELD OF THE INVENTION

The invention relates to highly integrated electrical modules in which bulk acoustic wave (BAW) resonators, operating with bulk acoustic waves are electrically connected as part of a filter circuit. Furthermore, the modules comprise circuit elements for the conversion of common-mode and differential-mode signals. The invention therefore relates to an interconnection of a BAW filter with a so-called balun circuit.

BACKGROUND

In order to reduce the coupling-in of interference signals, e.g. in RF circuits (radiofrequency circuits), signal-carrying paths are embodied as so-called "balanced" conducted signal lines. Balanced conducted differential-mode lines mean an increased circuitry outlay; however, they are less susceptible to common-mode interference and are therefore preferred for carrying signals in RF circuits—e.g. in mobile communication devices. Instead of the term "balanced" conducted signal lines, the term "symmetrically" conducted signal line is also used synonymously. "Unbalanced" conducted signal lines are correspondingly "asymmetrically" conducted signal lines.

Antennas of mobile communication devices generally supply a common-mode signal. Therefore, a balun circuit (balun=balanced/unbalanced converter) is necessary in order to convert the common-mode signal into a differential-mode signal for differential-mode lines. Furthermore, a filter circuit is necessary in order to suppress interfering frequencies in frequency ranges—e.g. outside a relevant passband.

Components operating with surface acoustic waves (SAW components, SAW=surface acoustic wave) can provide a good filter characteristic and also an intrinsic balun functionality. However, the technology of SAW components is restricted with regard to the maximum operating frequency and with regard to the bandwidth to be provided. Furthermore, SAW components always require a monocrystalline piezoelectric substrate, which is expensive and intricate to produce.

BAW resonators are better suited to use at higher frequencies and, on account of their manner of production, can be better integrated into external circuit environments based on silicon. While structures of coupled BAW resonators (e.g. in SCF=stacked crystal filter) are suitable, in principle, for forming filters having intrinsic balun functionality, there is the problem that the layer thickness dependence of the resonant frequency is to be taken into consideration and the necessary resonator quality factor should be achieved. SCF structures, in particular, react sensitively to thickness fluctuations such as occur during the deposition of the piezoelectric layers. Such fluctuations then impair the quality factor of the entire filter circuit.

U.S. Pat. No. 7,196,596 B2 describes FBAR filters (thin film bulk acoustic resonator filter) having an unbalanced conducted signal input and having a balanced conducted signal output. Corresponding filter circuits comprise FBAR resonators and also circuits of a balun which are electrically connected thereto. A balun comprises passive circuit components such as e.g. coupled transmission lines or capacitive or inductive elements, wherein the passive circuit components are arranged in metallization layers between dielectric layers. The layer stack composed of metallization layers and dielectric layers in which the balun functionality is integrated is arranged on a substrate alongside the stack containing the electrodes and piezo-layers of the FBAR resonators. The layer stack of the balun can be produced during the same process steps as the layers of the hermetic covering of the FBAR resonators.

Miniaturization of electrical components is still the most important requirement, principally from the mobile radio sector, in order to be able to make terminals even smaller, but principally to be able to equip them with additional functions. In addition to the demand for a small space requirement, it is a matter of concern for the manufacturers of electrical components to obtain a highest possible percentage of functioning modules, i.e. a lowest possible percentage of rejects, during the production process.

Therefore, it is an exemplary object of the present invention to specify a BAW component having balun functionality with a high resonator quality factor and a small space requirement, which component can be produced with a lower reject rate.

BRIEF SUMMARY

This example object is achieved according to aspects of the invention by means of a highly integrated electrical module as described herein. Advantageous configurations and also a production method emerge as described herein.

The electrical module according to aspects of the invention comprises a substrate having a top side and a cover, which is arranged above the top side of the substrate and which has an underside facing the substrate. The module furthermore comprises a layer construction (e.g., an assembly having structures that are arranged in layers or in a layered manner) arranged on the top side of the substrate and comprising a BAW resonator and a filter circuit, wherein the BAW resonator is electrically connected in the filter circuit. In the layer construction comprising the BAW resonator, a piezo-layer is arranged between two electrode layers. In addition, the module comprises a balun circuit, which comprises an interconnection of capacitive and inductive elements and which is electrically connected in series with the filter circuit. The substrate and the cover are parts of a housing enclosing the layer construction of the BAW resonator, the inner sides of which housing are formed at least in part by the top side of the substrate and the underside of the cover. In this case, at least one circuit element of the balun circuit is arranged at least in part on an inner side of the housing. The housing preferably tightly encloses the layer construction. The inner side includes not only the top side of the substrate and the underside of the cover but also the inner side areas of the one or more spacers as side walls which are arranged laterally with respect to the layer construction between cover and substrate and fix the cover relative to the substrate at a defined distance.

Such an electrical module has a higher degree of integration than known modules since a housing accommodating the BAW resonator also receives at least one of the circuit elements of the balun circuit. In particular such parts of the balun circuit which react sensitively to external ambient influences and require protection against harmful influences can be accommodated in a hermetically sealed housing in this way. The space requirement for circuit elements of the balun circuit outside the housing is thus reduced; in particular, this obviates the need for additional hermetic sealing of the sensitive elements of the balun circuit since they are concomitantly accommodated in the housing of the resonator.

By virtue of the fact that at least one circuit element of the balun circuit is arranged on an inner side of the housing, the space requirement of the overall circuit is reduced. Nevertheless, the resonator stack, i.e. the layer construction in which the resonator is arranged, and the relevant circuit element can in each case be produced or tested for functionality independently of one another. For example, if the circuit element is arranged on the inner side of the cover, the cover with the circuit element and the BAW resonator stack can be joined together to form an operational component. If the arrangement occurs, for example, where the resonator stack fulfills the desired specifications but the circuit element does not have a desired quality factor, then the resonator does not constitute a reject; the defective circuit element merely has to be exchanged for a functioning circuit element. Conversely, the circuit element can be retained—e.g. at the cover or some other inner area of the housing—if the resonator stack is defective. A corresponding module therefore has a small space requirement and enables reduced rejects during production.

In an advantageous configuration, a capacitive element of the balun circuit is arranged within the housing on the top side of the substrate. In this case, the capacitive element can be arranged for example alongside the layer construction in which the BAW resonator is integrated. The capacitive element can also be contained in a layer construction arranged on the layer construction containing the BAW resonator. Furthermore, the capacitive element can also be integrated in the same layer construction as the BAW resonator.

However, a capacitive element can also be arranged at the underside of the cover. It is particularly preferred, however, if a BAW resonator of the filter circuit is electrically connected as a capacitive element of the balun circuit. Specifically, the capacitive element is then part of the layer stack of the BAW resonators. In this case, it can, but need not, be acoustically coupled to the other resonators of the layer stack.

It is also preferred if an inductive element of the balun circuit is arranged within the housing—e.g. at the under side of the cover.

In an exemplary embodiment, all the elements of the balun circuit are arranged within the housing.

Inorganic materials such as LTCC (low-temperature co-fired ceramics), HTCC (high-temperature co-fired ceramics), silicon or glass are appropriate materials for the substrate. As an alternative, organic materials such as laminate or BT (bismaleimide triazine resin) are also appropriate. The substrate can be composed of one of these materials. However, it can also be composed of a combination of different materials and comprise one of the materials mentioned above.

The inorganic materials LTCC, HTCC, silicon, lithium tantalate $LiTaO_3$ or lithium niobate $LiNiO_3$ are appropriate as material for the cover. Organic materials such as laminate and BT also constitute possible cover materials. The cover can be composed of one of these materials. However, it can also be composed of a combination of different materials and comprise one of the abovementioned materials alongside other materials not mentioned.

The cover of the component can be composed of a piezoelectrically active material—e.g. lithium tantalate or lithium niobate. This is advantageous if the cover comprises interdigital structures of a balun circuit which operates with surface acoustic waves or with guided surface acoustic waves. As already mentioned in the introduction above, SAW filter circuits are also suitable for providing a balun functionality. With a combination—as proposed here—of a BAW filter with a balun embodied using SAW technology, the advantages of both technologies are utilized in order to unite a component having a small space requirement and a good filter and balun functionality. In this case, the layer stack of the BAW filters can be integrated without any problems into a silicon technology environment, while the arrangement of the interdigital structures of the SAW balun can be optimized with regard to the balun functionality, without having to optimize the SAW structures with regard to a filter effect. In particular, the sensitive SAW structures are protected against harmful ambient influences by the housing. Alongside balun circuits which operate purely with surface acoustic waves (SAW), also appropriate are balun circuits having GBAW structures which operate with guided bulk acoustic waves (GBAW).

The filter circuit can comprise either a ladder-type filter circuit composed of BAW resonators or a lattice-type filter circuit composed of BAW resonators. Moreover, the filter circuit can be partly embodied with a ladder-type structure and partly embodied with a lattice-type structure.

In the present module, the BAW filter circuit and the balun circuit are connected in series. It is therefore advantageous if the filter circuit is embodied as balanced and the balun circuit has an unbalanced conducted signal port—e.g. a signal input—and a balanced conducted signal port—e.g. a signal output—which is electrically connected to the filter circuit. The filter circuit is therefore electrically connected to the balun circuit via symmetrically conducted signal lines.

By contrast, if the filter circuit is electrically connected between the antenna and the balun circuit, then it is advantageous if the filter circuit is electrically connected to the balun circuit via an unbalanced conducted signal line.

In an advantageous configuration, the balun circuit comprises a first, a second and a third branch, which are electrically connected to one another via a node. In the second branch a series capacitive element is electrically connected, and an inductive element electrically connects the second branch to ground. In the third branch a series inductive element is electrically connected, and a capacitive element electrically connects the third branch to ground. The first branch can thereby constitute an asymmetrically conducted signal port as signal input, while the second and third branches constitute a symmetrically conducted signal port as signal output. Conversely, the second and third branches can also constitute a symmetrically conducted signal input, while the first branch constitutes an asymmetrically conducted signal output.

Furthermore, it is preferred if the filter circuit comprises at least one parallel resonator in a shunt branch electrically connected to ground, and the filter circuit comprises at least one series resonator which electrically connects a series branch to the balun circuit.

In an embodiment, the balun circuit comprises a first, a second and a third branch, wherein in the second branch a series resonator operating with acoustic waves is electrically connected and an inductive element electrically connects the second branch to ground. In the third branch a series inductive element is electrically connected, and a resonator operating with acoustic waves electrically connects the third branch to ground. Here, too, the first branch can constitute an asymmetrically conducted signal input or output, while the second and third branches constitute symmetrically conducted outputs or inputs, respectively. A resonator is called a "series" resonator if it is electrically connected in parts of the signal path in such a way that balanced or unbalanced conducted signals are conducted through it.

A first branch of the balun circuit preferably has a line impedance of 50 Ω, while a second and a third branch have a line impedance of 100 Ω.

An aspect of a method for producing a corresponding highly integrated electrical module includes applying a layer construction having a capacitive element of the balun circuit together with a layer stack comprising BAW resonators to the substrate.

In an advantageous development of the method, BAW resonators and a capacitive element of the balun circuit together in one and the same layer stack are applied to the substrate.

The highly integrated electrical module is explained in greater detail below on the basis of exemplary embodiments and with reference to associated schematic figures, in which:

DETAILED DESCRIPTION

Figure 1:
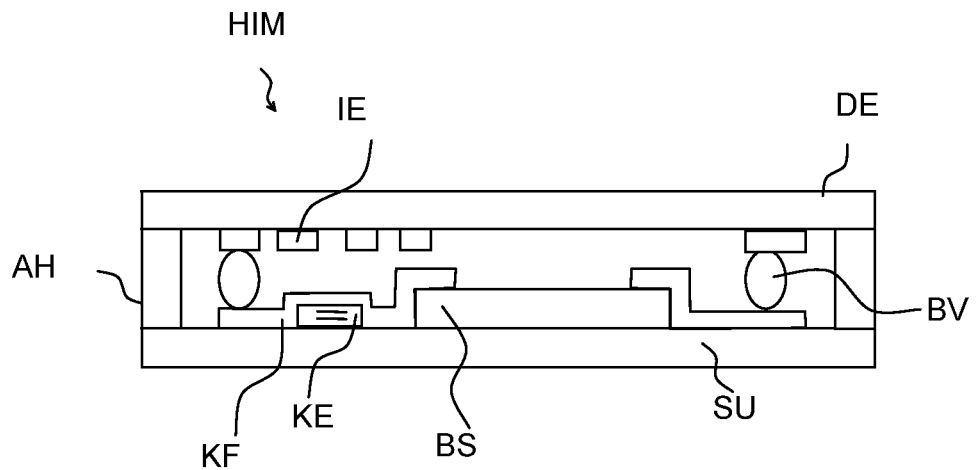
FIG. 1 shows a cross section through a module according to an aspect of the invention.
Figure 2A:
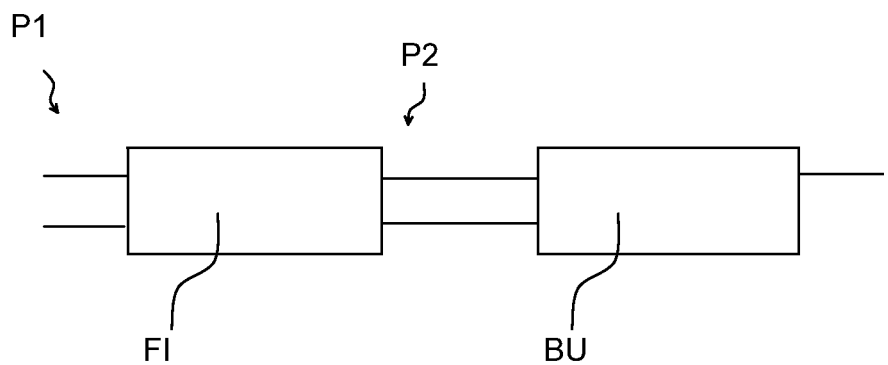
FIG. 2a shows a filter circuit which is electrically connected to a balun circuit via symmetrically conducted signal lines.
Figure 2B:
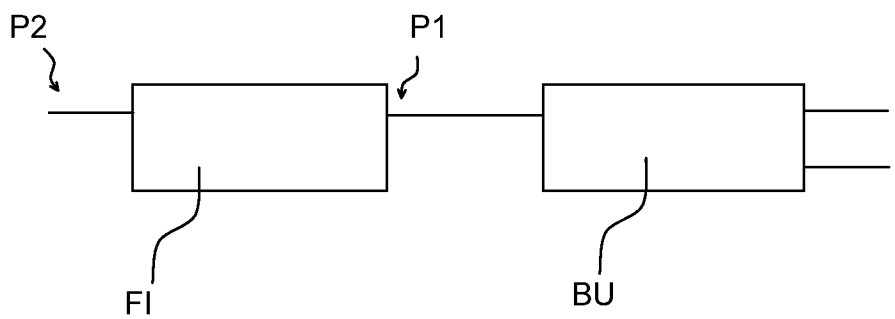
FIG. 2b shows a filter circuit which is electrically connected to a balun circuit via an asymmetrically conducted signal line.
Figure 3:
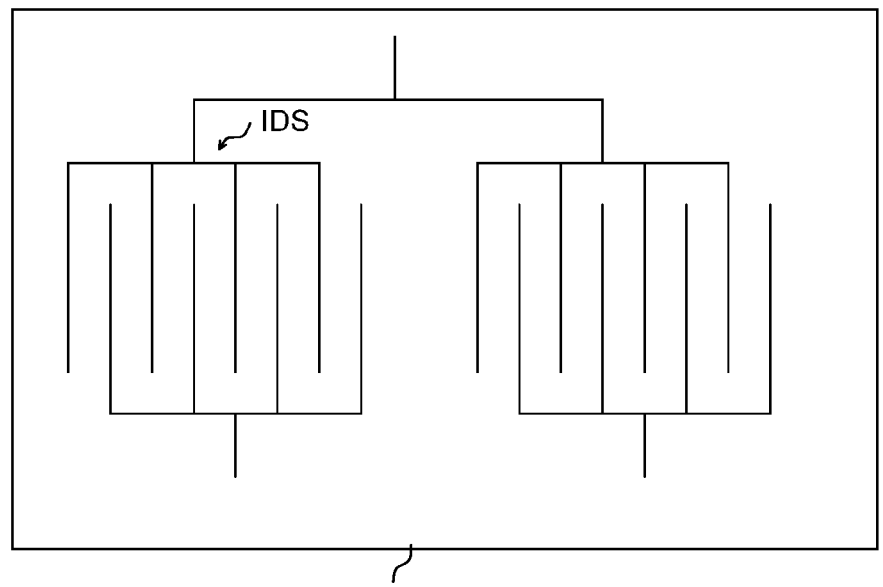
FIG. 3 shows the arrangement of interdigital structures on the underside of the cover.

FIG. 1 illustrates a cross section through a highly integrated electrical module HIM according to an aspect of the invention. A layer construction or BAW resonator stack BS is arranged on the surface of a substrate SU. The layer construction includes the electrodes and piezoelectric layers required for operation, and a filter circuit FI, like the one shown in FIG. 4a or 4b, which includes one or more BAW resonators. The module HIM also includes a balun circuit BU, like the one shown in FIG. 5a or 5b, electrically connected in series with the filter circuit FI, such as shown in FIG. 2a or 2b. A capacitive element KE of the balun circuit BU is arranged alongside the BAW resonator stack BS on the surface of the substrate SU; electrodes as metallization areas can be arranged in a plurality of layers. The cover DE is arranged in a manner spaced apart from the substrate by means of spacers AH in such a way that the substrate SU, the cover DE and the spacers AH effect a hermetic encapsulation of the interior of the highly integrated module. An inductive element IE of the balun circuit BU, which can consist of structured metallization lines such as shown in FIG. 3, is arranged on the underside of the cover DE. Contact areas KF are arranged on the surface of the substrate SU, which contact areas are electrically connected to the capacitive element KE of the balun circuit BU and the BAW resonator stack BS, on the one hand, and by means of bump connections BV to structured metallization—e.g. of the inductive element IE—on the underside of the cover DE, on the other hand.

FIG. 2a illustrates a possible order of the interconnection of a filter circuit FI of the layer construction BS and a balun circuit BU of the module HIM: both the input P1 and the output P2 of the filter circuit FI are embodied symmetrically. The transmission of RF signals from the filter circuit FI to the balun circuit BU is correspondingly embodied symmetrically. Such an arrangement can be used in a transmission path if the balun circuit BU is electrically connected between the filter circuit FI and an antenna (not illustrated).

By contrast, FIG. 2b illustrates an alternate interconnection of the filter circuit FI and the balun circuit BU, where both the input P1 and the output P2 of the filter circuit FI are configured asymmetrically, and the signal line between the filter circuit FI and the balun circuit BU is correspondingly configured asymmetrically. Such an interconnection can be used in a reception path if, e.g., the filter circuit FI is electrically connected between an antenna (not shown) and the balun circuit BU.

FIG. 3 illustrates how interdigital structures IDS of the balun circuit BU can be arranged in an interlocking finger configuration on the underside of the cover DE in order to realize a balun functionality, for example. These interdigital structures IDS can correspond to the inductive element IE of the balun circuit BU, for example.

Figure 4A:
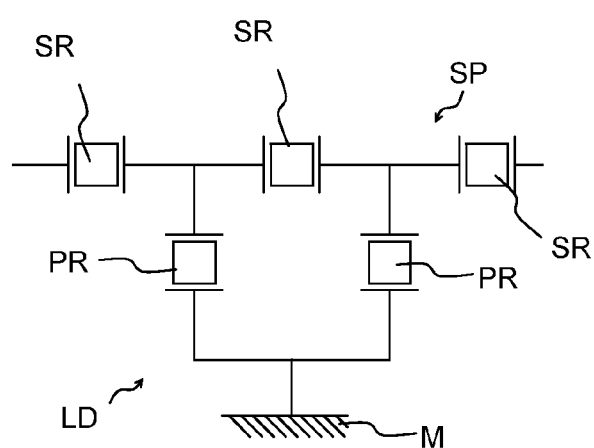
FIG. 4a shows a filter circuit with a ladder-type structure.

FIG. 4a illustrates an interconnection of resonators in a ladder-type arrangement LD of the filter circuit FI. In this example, three series resonators SR are connected in series and a respective parallel resonator PR in a parallel path connects the signal path SP to ground M.

Figure 4B:
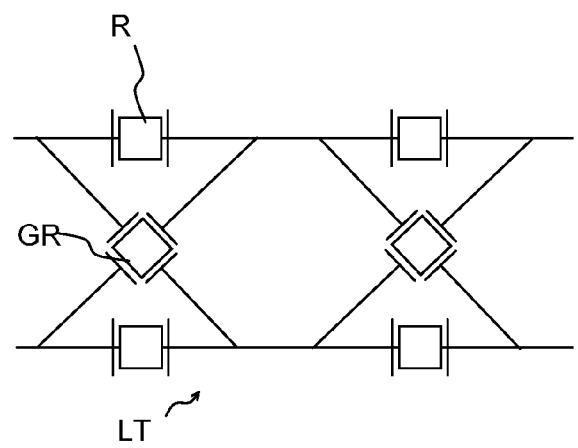
FIG. 4b shows a filter circuit with a lattice-type structure.

FIG. 4b illustrates an alternate configuration of the filter circuit FI, which is composed of resonators R arranged in a lattice-type structure LT. In contrast to the filter circuit LD in FIG. 4a, which is embodied in an unbalanced fashion, the filter circuit LT in FIG. 4b is embodied in balanced fashion. The lattice-type structure LT can comprise coupled resonators GR which have been deposited e.g. in an SCF (stack crystal filter) arrangement on the substrate SU. The balun functionality, however, is realized by means of the balun circuit provided for this purpose. Therefore, the coupled resonators GR do not have to be optimized with regard to a balun functionality. Therefore, their quality factor is not reduced by the fact that the resonators have to fulfill specifications with regard to a balun circuit BU.

Figure 5A:
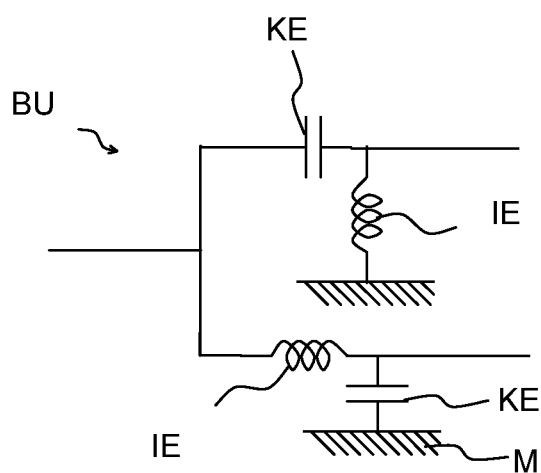
FIG. 5a shows a balun circuit having three signal paths in which capacitive and inductive elements are electrically connected.

FIG. 5a illustrates an exemplary interconnection of capacitive elements KE and inductive elements IE which are electrically connected in a balun circuit BU with three paths. In a second path a capacitive element KE is connected in series, and an inductive element IE electrically connects the second path to ground M. In a third path an inductive element IE is connected in series, and a capacitive element KE electrically connects the third path to ground M. In this example, the second and third paths constitute the balanced signal port, while the first signal path, in which no passive element is electrically connected, constitutes the unbalanced port.

Figure 5B:
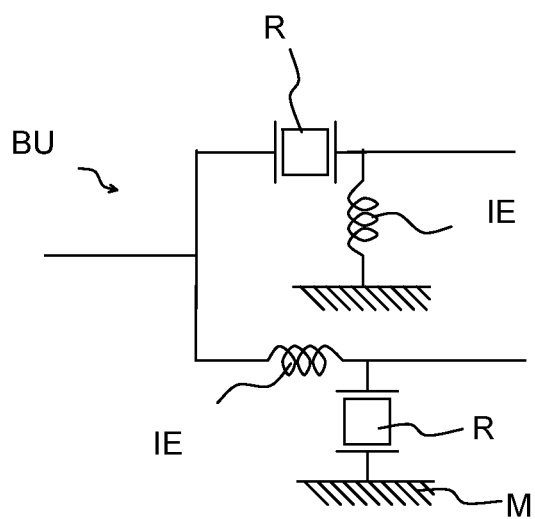
FIG. 5b shows a balun circuit having three signals paths in which resonators and inductive elements are electrically connected.

FIG. 5b illustrates an alternate configuration of a balun circuit BU in which a resonator R is electrically connected in series in a first path, while an inductive element IE electrically connects the second path to ground M. In a third path an inductive element IE is electrically connected in series, while a resonator R electrically connects the third path to ground M.

A highly integrated module according to aspects of the invention is not restricted to any of the exemplary embodiments described. Combinations of the exemplary embodiments and variations which comprise e.g. further signal paths, further filter elements, further resonators or further inductive or capacitive elements likewise constitute exemplary embodiments according to the invention.

List of Reference Symbols
AH: Spacers
BS: BAW resonator stack
BU: Balun
BV: Bump connection
DE: Cover
FI: Filter
GR: Stacked resonators
HIM: Highly integrated electrical module
IDS: Interdigital structures
IE: Inductive element
KE: Capacitive element
KF: Contact area
LD: Ladder-type filter circuit
LT: Lattice-type filter circuit
M: Ground
P1: Input of the filter circuit
P2: Output of the filter circuit
PR: Parallel resonator
R: Resonator
SR: Series resonator
SU: Substrate

What is claimed is:

1. A highly integrated electrical module, comprising:
a substrate having a top side;
a cover, which is arranged above the top side of the substrate, having an underside facing the substrate;
a layer construction arranged on the top side of the substrate, the layer construction comprising a filter circuit that includes a bulk acoustic wave (BAW) resonator, wherein a piezo-layer is arranged between two electrode layers in the layer construction; and
a balun circuit having an interconnection of capacitive and inductive elements, the balun circuit being electrically connected in series with the filter circuit;
wherein the substrate and the cover are parts of a housing enclosing the layer construction, the inner sides of the housing being formed at least in part by the top side of the substrate and the underside of the cover,
wherein at least one circuit element of the balun circuit is arranged at least in part on an inner side of the housing, and
wherein the balun circuit includes a capacitive element, the capacitive element being integrated in the layer construction.

2. The module as claimed in claim 1, wherein the balun circuit includes a capacitive element, the capacitive element being arranged within the housing on the top side of the substrate.

3. The module as claimed in claim 1, wherein the BAW resonator of the filter circuit is electrically connected as a capacitive element of the balun circuit.

4. The module as claimed in claim 1, wherein the balun circuit includes an inductive element, the inductive element being arranged within the housing at the underside of the cover.

5. The module as claimed in claim 1, wherein all of the capacitive and inductive elements of the balun circuit are arranged within the housing.

6. The module as claimed in claim 1, wherein the substrate is composed of a material that includes low-temperature co-fired ceramics (LTCC), high-temperature co-fired ceramics (HTCC), glass, silicon, laminate, or bismaleimide triazine (BT).

7. The module as claimed in claim 1, wherein the cover is composed of a material that includes low-temperature co-fired ceramics (LTCC), high-temperature co-fired ceramics (HTCC), silicon, lithium tantalite ($LiTaO_3$) and litium niobate ($LiNiO_3$), laminate, or bismaleimide triazine (BT).

8. The module as claimed in claim 1, wherein the cover comprises interdigital structures of the balun circuit operating with surface acoustic waves (SAW) or with guided bulk acoustic waves (GBAW), the interdigital structures being electrically connected to the filter circuit.

9. The module as claimed in claim 1, wherein the layer construction includes a plurality of BAW resonators, and wherein the filter circuit of the layer construction includes a ladder-type interconnection of the plurality of BAW resonators.

10. The module as claimed in claim 1, wherein the layer construction includes a plurality of BAW resonators, and wherein the filter circuit of the layer construction includes a lattice-type interconnection of the plurality of BAW resonators.

11. The module as claimed in claim 1, wherein the filter circuit is electrically connected to the balun circuit via symmetrically conducted signal lines.

12. The module as claimed in claim 1, wherein the filter circuit is electrically connected to the balun circuit via an asymmetrically conducted signal line.

13. The module as claimed in claim 1, wherein
the balun circuit comprises a first, a second and a third branch, and a series capacitive element, an inductive element, a series inductive element, and a capacitive element,
in the second branch the series capacitive element is electrically connected and the inductive element electrically connects the second branch to ground, and
in the third branch the series inductive element is electrically connected and the capacitive element electrically connects the third branch to ground.

14. The module as claimed in claim 1, wherein
the filter circuit comprises at least one parallel resonator in a shunt branch electrically connected to ground,
the filter circuit comprises at least one series resonator that electrically connects a series branch to the balun circuit.

15. The module as claimed in claim 1, wherein
the balun circuit comprises a first, a second and a third branch, and an inductive element and a series inductive element,
in the second branch a series resonator operating with acoustic waves is electrically connected and the inductive element electrically connects the second branch to ground, and
in the third branch the series inductive element is electrically connected and a resonator operating with acoustic waves electrically connects the third branch to ground.

16. The module as claimed in claim 1, wherein the balun circuit includes a first branch having a line impedance of 50 ohms, a second branch having a line impedance of 100 ohms, and a third branch having a line impedance of 100 ohms.

17. A method for producing a highly integrated electrical module, comprising:
arranging a cover above a top side of a substrate, the cover having an underside facing the substrate;
arranging a layer construction on the top side of the substrate, the layer construction comprising a filter circuit that includes a bulk acoustic wave (BAW) resonator, wherein a piezo-layer is arranged between two electrode layers in the layer construction;
electrically connecting a balun circuit in series with the filter circuit, the balun circuit having an interconnection of capacitive and inductive elements, the layer construction including a capacitive element of the balun circuit;
integrating the capacitive element of the balun in the layer construction;
enclosing the layer construction by a housing formed at least in part by the top side of the substrate and the underside of the cover, wherein the substrate and the cover are parts of the housing;
arranging at least one circuit element of the balun circuit at least in part on an inner side of the housing; and
applying the capacitive element of the balun circuit together with a resonator stack comprising the BAW resonator to the substrate.

18. A method for producing a highly integrated electrical module, comprising:
arranging a cover above a top side of a substrate, the cover having an underside facing the substrate;
arranging a layer construction on the top side of the substrate, the layer construction comprising a filter circuit that includes a bulk acoustic wave (BAW) resonator, wherein a piezo-layer is arranged between two electrode layers in the layer construction;
electrically connecting a balun circuit in series with the filter circuit, the balun circuit having an interconnection of capacitive and inductive elements, wherein the BAW resonator and a capacitive element of the balun circuit are part of a resonator stack;
integrating the capacitive element of the balun circuit in the layer construction;
enclosing the layer construction by a housing formed at least in part by the top side of the substrate and the underside of the cover, wherein the substrate and the cover are parts of the housing;
arranging at least one circuit element of the balun circuit at least in part on an inner side of the housing;
applying a resonator stack comprising the BAW resonator and the capacitive element to the substrate.

19. A highly integrated electrical module, comprising:
a substrate having a top side;
a cover, which is arranged above the top side of the substrate, having an underside facing the substrate;
a layer construction arranged on the top side of the substrate, the layer construction comprising a filter circuit that includes a bulk acoustic wave (BAW) resonator, wherein a piezo-layer is arranged between two electrode layers in the layer construction; and
a balun circuit having an interconnection of capacitive and inductive elements, the balun circuit being electrically connected in series with the filter circuit;
wherein the substrate and the cover are parts of a housing enclosing the layer construction, the inner sides of the housing being formed at least in part by the top side of the substrate and the underside of the cover,
wherein at least one circuit element of the balun circuit is arranged at least in part on an inner side of the housing, and
wherein the BAW resonator of the filter circuit is electrically connected as a capacitive element of the balun circuit.

20. A highly integrated electrical module, comprising:
a substrate having a top side;
a cover, which is arranged above the top side of the substrate, having an underside facing the substrate;
a layer construction arranged on the top side of the substrate, the layer construction comprising a filter circuit that includes a bulk acoustic wave (BAW) resonator, wherein a piezo-layer is arranged between two electrode layers in the layer construction; and
a balun circuit having an interconnection of capacitive and inductive elements, the balun circuit being electrically connected in series with the filter circuit;
wherein the substrate and the cover are parts of a housing enclosing the layer construction, the inner sides of the housing being formed at least in part by the top side of the substrate and the underside of the cover,
wherein at least one circuit element of the balun circuit is arranged at least in part on an inner side of the housing, and
wherein the balun circuit includes an inductive element, the inductive element being arranged within the housing at the underside of the cover.

* * * * *